(12) United States Patent
Pisati et al.

(10) Patent No.: US 7,024,447 B2
(45) Date of Patent: Apr. 4, 2006

(54) TIME CONTINUOUS FIR FILTER TO IMPLEMENT A HILBERT TRANSFORM AND CORRESPONDING FILTERING METHOD

(75) Inventors: Valerio Pisati, Bosnasco (IT); Augusto Rossi, Pavia (IT); Giorgio Betti, Pogliano Milanese (IT); Marco Cazzaniga, Ispra (IT)

(73) Assignee: STMicroelectronics S.r.l., Agrate Brianza (IL)

( * ) Notice: Subject to any disclaimer, the term of this patent is extended or adjusted under 35 U.S.C. 154(b) by 857 days.

(21) Appl. No.: 09/794,303

(22) Filed: Feb. 27, 2001

(65) Prior Publication Data

US 2001/0037353 A1    Nov. 1, 2001

(30) Foreign Application Priority Data

Feb. 29, 2000    (EP) .................................. 00830154

(51) Int. Cl.
*G06G 7/02*    (2006.01)
*G06F 17/10*    (2006.01)

(52) U.S. Cl. ...................................... 708/819; 708/316

(58) Field of Classification Search ................ 708/313, 708/316, 319, 819; 375/229–236; 360/55–68
See application file for complete search history.

(56) References Cited

U.S. PATENT DOCUMENTS

| | | | | |
|---|---|---|---|---|
| 4,698,680 A | * | 10/1987 | Lewis et al. | ................. 348/614 |
| 4,791,597 A | * | 12/1988 | Miron et al. | ................. 708/306 |
| 4,907,100 A | | 3/1990 | Nishiyama et al. | ............ 360/45 |
| 5,255,133 A | | 10/1993 | Yamamori et al. | ............. 360/67 |
| 5,262,972 A | * | 11/1993 | Holden et al. | ............... 708/316 |
| 5,321,559 A | * | 6/1994 | Nguyen et al. | ................ 360/46 |
| 5,561,617 A | * | 10/1996 | van der Wal | ............... 708/308 |
| 5,736,909 A | * | 4/1998 | Hauser et al. | ............... 333/166 |
| 5,854,717 A | | 12/1998 | Minuhin | ....................... 360/65 |
| 6,032,171 A | * | 2/2000 | Kiriaki et al. | .............. 708/819 |
| 6,035,320 A | * | 3/2000 | Kiriaki et al. | .............. 708/819 |

\* cited by examiner

*Primary Examiner*—Tan V. Mai
(74) *Attorney, Agent, or Firm*—Lisa K. Jorgenson; Allen, Dyer, Doppelt, Milbrath & Gilchrist, P.A.

(57) ABSTRACT

A finite impulse response (FIR) filter for implementing a Hilbert transform is provided. The FIR filter includes a plurality of programmable delay cells connected in cascade between an input terminal of the FIR filter and an output terminal of the FIR filter. Each programmable delay cell has associated therewith a constant filter coefficient and a programmable delay coefficient. The FIR filter is also applicable for processing signals originated by the reading of data from a magnetic storage media which employs perpendicular recording.

27 Claims, 5 Drawing Sheets

TIME CONTINUOUS FIR FILTER TO IMPLEMENT A HILBERT TRANSFORM AND CORRESPONDING FILTERING METHOD

FIELD OF THE INVENTION

The preset invention relates to a time-continuous finite impulse response (FIR) filter for implementing a Hilbert transform, and to a method of filtering signals whose spectrum are unknown a priori. That is, the spectrum of the signals are not known before being filtered. In particular, the present invention relates to a circuit structure for programmable time-continuous analog filters specifically intended for read/write operations from/into magnetic storage media.

BACKGROUND OF THE INVENTION

A circuit structure designed to implement a Hilbert transform has a time-continuous FIR (Finite Impulse Response) filter for its basic component, as readily understood by one skilled in the art. More particularly, a Hilbert transform is essentially a constant module 90° phase shifter. This characteristic can be implemented by an impulsive response FIR filter as illustrated in FIG. 5, for example. The frequency response of such a FIR filter can better approach an ideal response by increasing the filter length. The accompanying FIG. 1 shows schematically a conventional FIR filter which includes a plurality of delay cells cascade connected together between an input terminal and an output terminal.

A distinguishing feature of the cells is that they carry the same amount of time delay, designated Td. The signal output from each cell is then multiplied by a predetermined coefficient $c_0, \ldots, c_n$. The summation of all the signals, each multiplied by a respective one of the coefficients $c_0, \ldots, c_n$ gives a value Y representing the impulse response of the filter.

The performance of a time-continuous FIR filter is also linked to another parameter, that is, the bandwidth of the signal being input to the chain of the delay cells. The greater the bandwidth, the larger becomes the number of the FIR filter coefficients required for a closer approach to the ideal Hilbert transform.

It is a recognized fact that the frequency response of an amplified signal amplitude is related to the frequency response of the signal phase. As the input signal bandwidth grows wider, the phase frequency response becomes smaller, and the so-called group delay is reduced. In fact, the group delay is the derivative of the phase with respect to frequency.

In other words, with an input signal having a broad bandwidth, a FIR filter with a very large number of coefficients must be used to obtain a desired frequency response. However, this requires fairly complicated and expensive circuit structures, and a demanding one in terms of circuit area.

Furthermore, where the input signal has different spectrum forms, there are no circuit structures available which can handle the frequency response in an optimum manner. It is customary in such cases to adopt either of two different approaches.

A first approach employs a FIR filter which has a fixed number of coefficients $c_0, \ldots, c_n$ so that the filter performances are those as desired for all the spectrum inputs. A second approach uses a filter having coefficients $c_0, \ldots, c_n$ which can be programmed to fit the spectrum of the input signal.

The first approach obviously involves a larger number of elements than the second approach. However, the basic element in the first approach is that it is simpler to construct on account of the coefficients being non-programmable. While being advantageous from several aspects and substantially meeting current requirements, neither the first nor the second of the above approaches fill all the demands of processing input signals whose spectrum is unknown a priori.

SUMMARY OF THE INVENTION

The technical problem underlying the present invention is to provide a FIR filter design for implementing a Hilbert transform, which has appropriate structural and functional features to enable processing of signals whose spectrum are unknown beforehand, thereby overcoming the limitations and drawbacks of prior art designs.

The principle behind the present invention is to use a FIR filter with constant coefficients, and optimizing the filter response for the input signal spectrum by modifying the time delay of the cells.

Based on this principle, the technical problem is solved by a filter as previously indicated and defined in Claims 1 and following.

The technical problem is further solved by a filtering method for processing signals having spectrum unknown beforehand, as defined in Claims 5 and following.

BRIEF DESCRIPTION OF THE DRAWINGS

The features and advantages of a filter and filtering method according to the invention will be apparent from the following description of preferred embodiments thereof, given by way of a non-limitative example with reference to the accompanying drawings.

DETAILED DESCRIPTION OF THE PREFERRED EMBODIMENTS

Figure 3:
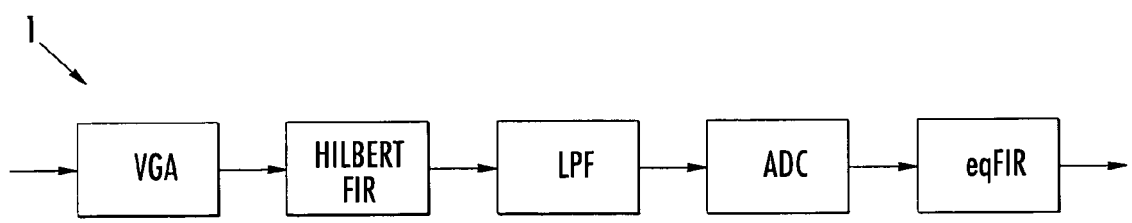
FIG. 3 is a block diagram of a PRLM decoding arrangement according to the present invention.

Referring to the drawings, and in particular to the example of FIG. 3, the block structure of a Hilbert transform according to the present invention is generally shown at 1 in schematic form. One possible application of the invention concerns the method of recording logic information in magnetic storage media, such as hard disks, for example.

In particular, an object of the present invention is to increase storage density by allowing the logic information to be recorded in the magnetic storage medium along a vertical direction. This recording method is known as "perpendicular recording" and affords increased storage density for a given area of the magnetic storage medium over "longitudinal recording". Longitudinal recording is the type of magnetization currently in use. Perpendicular recording effectively enhances the storage density of information in magnetic media, such as hard disks.

Figure 1:
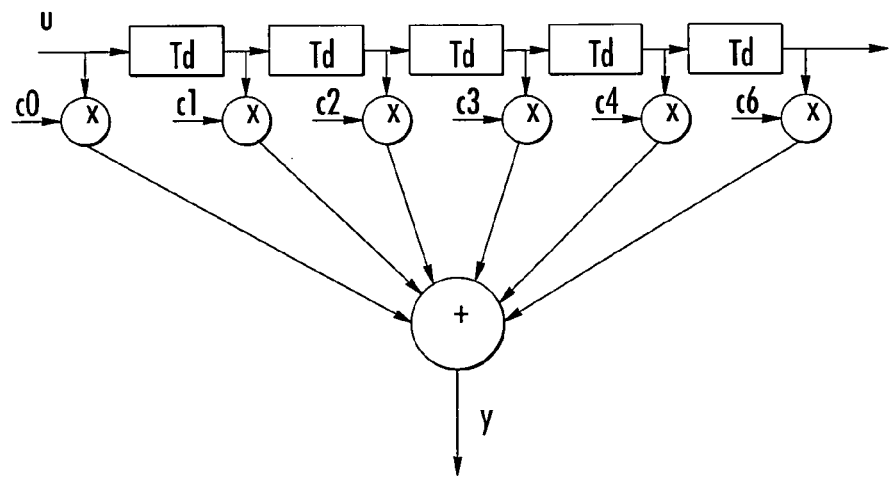
FIG. 1 shows schematically a conventional FIR filter structure according to the prior art.
Figure 2:
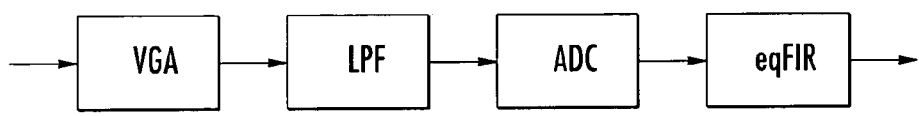
FIG. 2 is a block diagram of a PRLM decoding arrangement according to the prior art.

To decode a signal from longitudinal recording, a decoding arrangement of the Partial Response with Maximum Likelyhood type, shown schematically in FIG. 2, is usually employed. A first block VGA is a voltage gain amplifier which is input a signal from a device arranged to read data from a magnetic storage medium, which is not shown because it is conventional.

Connected to the output of the block VGA is a low-pass filter LPF having an analog-to-digital converter ADC placed downstream of it. An equalizer eqFIR is connected to the output of the converter ADC. The arrangement shown in FIG. 2 can be advantageously modified for processing and decoding signals from perpendicular recording.

On account of the properties of the Hilbert transform, the output signal from a Hilbert filter FIR is quite similar to the input signal to the low-pass filter LPF of FIG. 2. Accordingly, the same decoding arrangement used for longitudinal recording can be used for perpendicular recording if a Hilbert filter FIR is connected in the block chain.

More particularly, as shown in the example of FIG. 3, the Hilbert filter FIR is connected between the block VGA and the low-pass filter LPF. Plotted in FIG. 4 is an impulse response relating to two different magnetizations originating from a positive isolated transition, a double transition (d-pulse), and a negative isolated transition.

Figure 4:
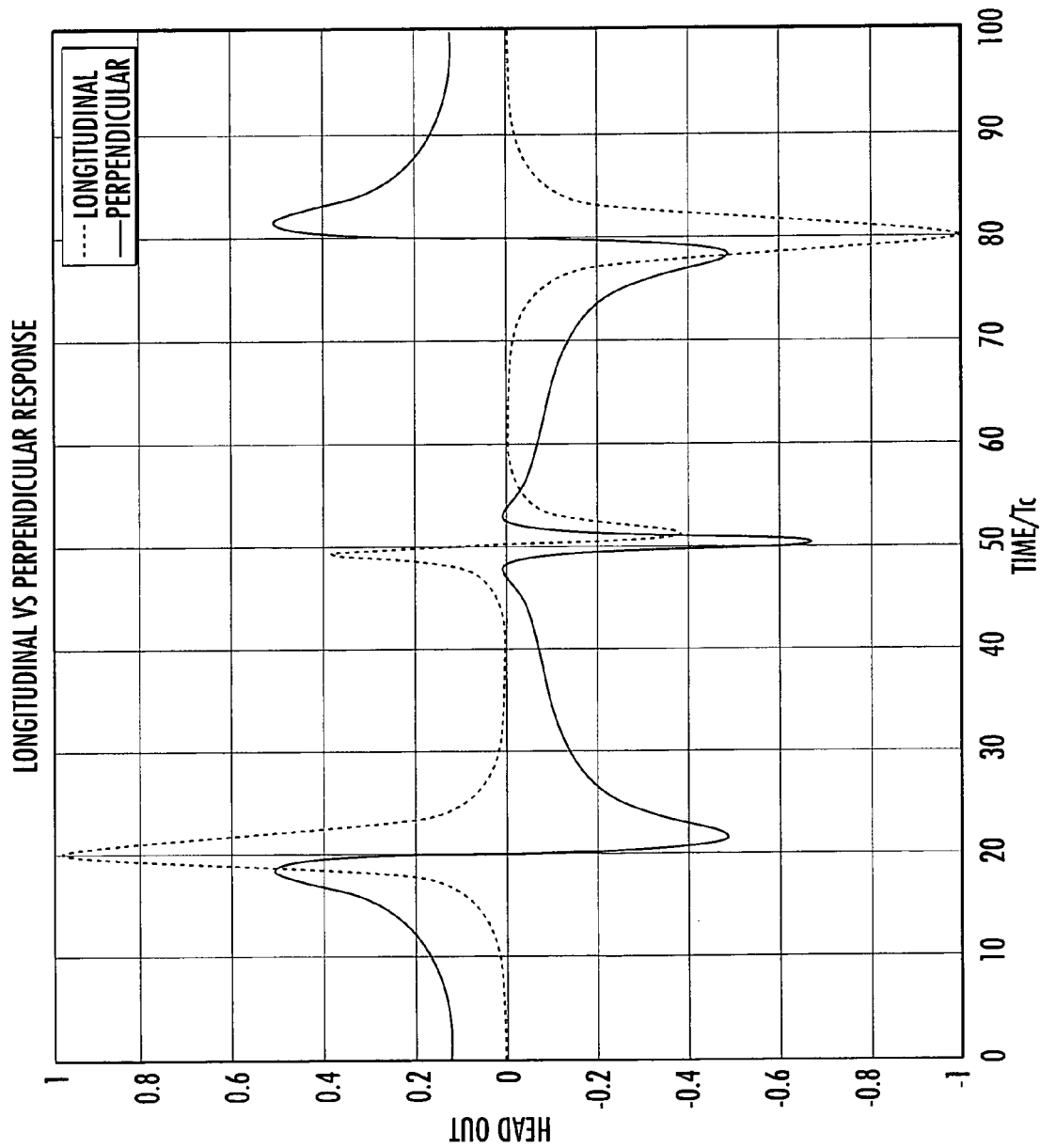
FIG. 4 shows comparative plots of response vs. time, respectively, for longitudinal recording and perpendicular recording signals relating to the reading of data from magnetic storage media according to the prior art.
Figure 5:
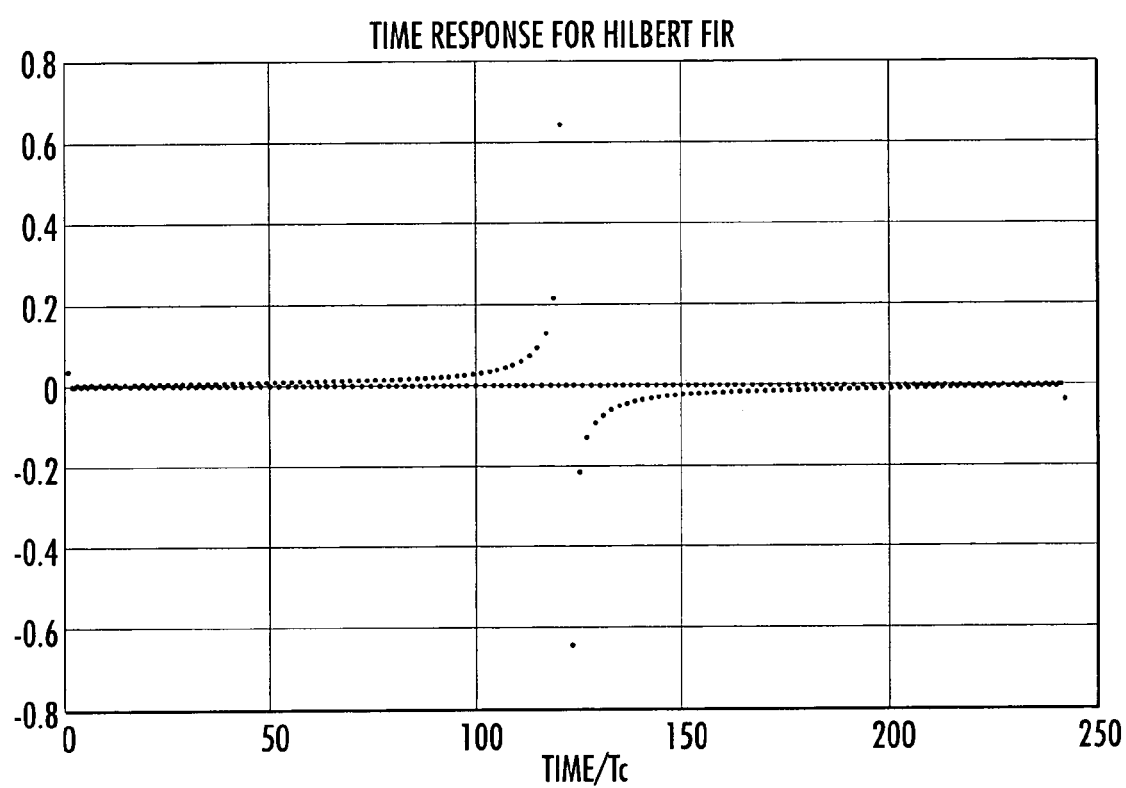
FIG. 5 is a plot of response vs. time for a Hilbert FIR filter according to the prior art.

With the decoding arrangement illustrated in FIG. 3, the signal indicated by a solid line in FIG. 4 relates to perpendicular recording and can be converted to a signal as indicated by the dashed line, which is representative of longitudinal recording.

In essence, to recover a gain variation, particularly a gain attenuation, obtaining an increase in gain from another portion of the decoding arrangement was considered. For this purpose, the designs of the low-pass filter LPF and the equalizer eqFIR of FIG. 3 have been altered with respect to an ideal Hilbert filter to compensate for the less-than-ideal performance of the near-Hilbert filter.

Figure 6A:
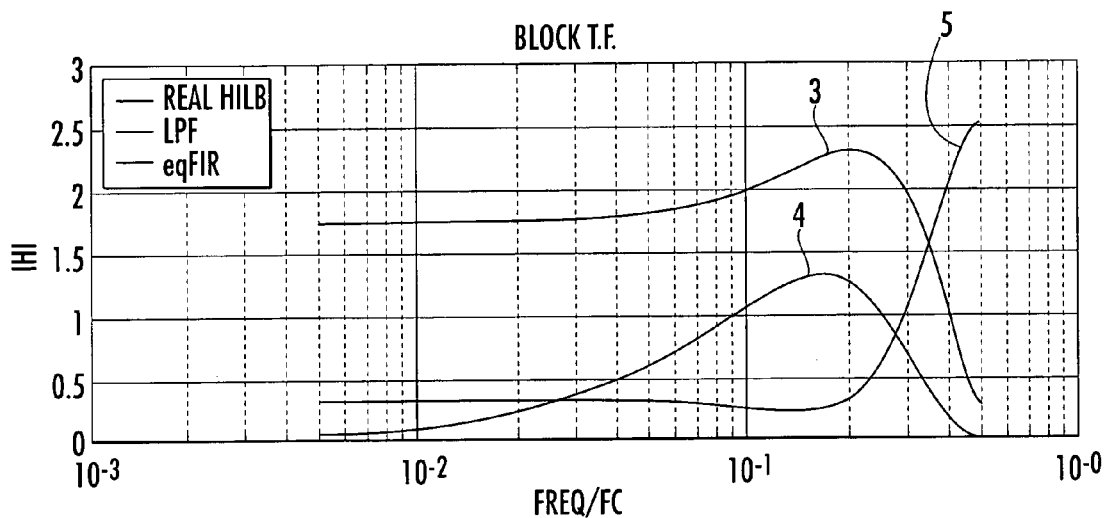
FIGS. 6A and 6B are respective plots of frequency response for components of the decoding arrangement shown in FIG. 4.
Figure 6B:
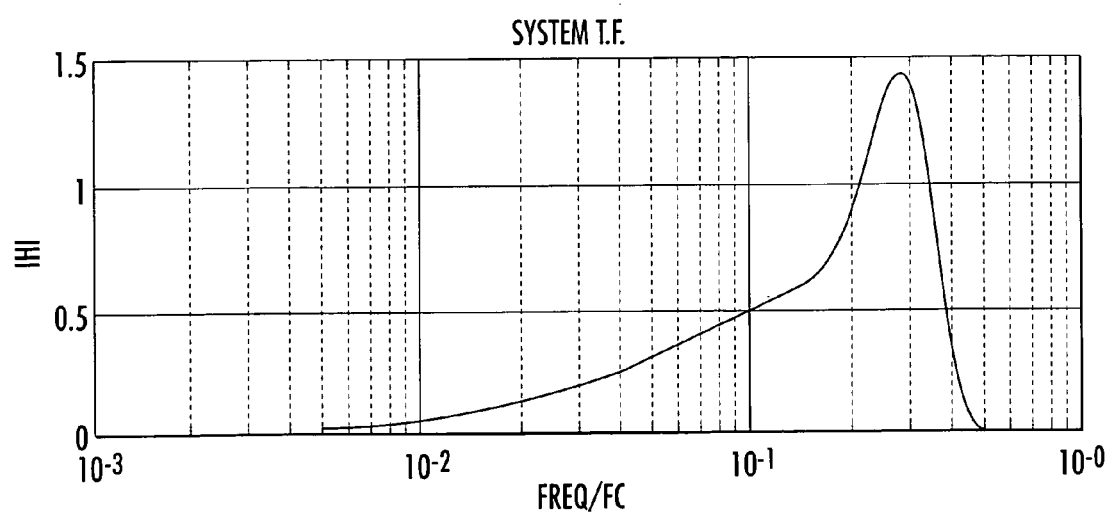

Reference is now made to the graph in FIG. 6A, which shows a curve 3 relating to the transfer function of the low-pass filter, a curve 4 for the equalizer function, and a curve 5 for the Hilbert filter FIR. With this approach the value of the coefficients of the filter FIR, which reproduce the Hilbert transform, becomes a function of the input signal spectrum. This spectrum is dependent on the stored data packing density.

Thus, the values of FIR would have to be modified according to the more or less inwardly located track of the magnetic storage medium which contains the information to be read, since the density of the stored information and with it the signal spectrum is dependent on which track is being read. Advantageously, this invention provides instead for a modification of the delay value Td of the cells which comprise the filter.

Td is the value of the delay element of each cell in the time-continuous filter FIR. As can be appreciated from FIGS. 7B and 7C, to program the delay value Td is to program the values of the coefficients $c_0, \ldots, c_n$ of the time-continuous filter FIR. In these figures, Tc is the inverse channel period of the operating frequency fc, which changes with the position of the read/write head on the magnetic storage medium.

Figure 7A:
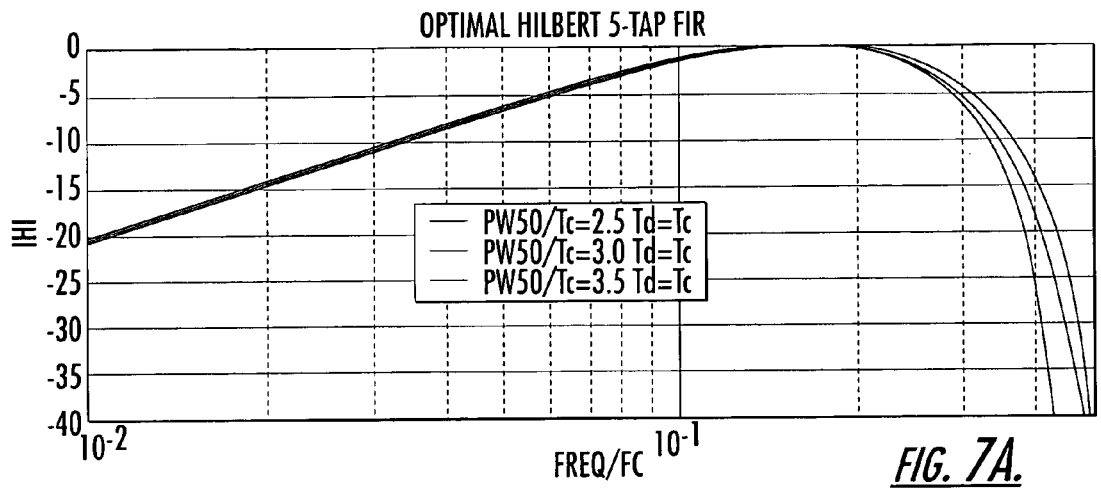
FIGS. 7A, 7B and 7C are respective plots of frequency response for the Hilbert FIR filter according to the present invention.
Figure 7B:
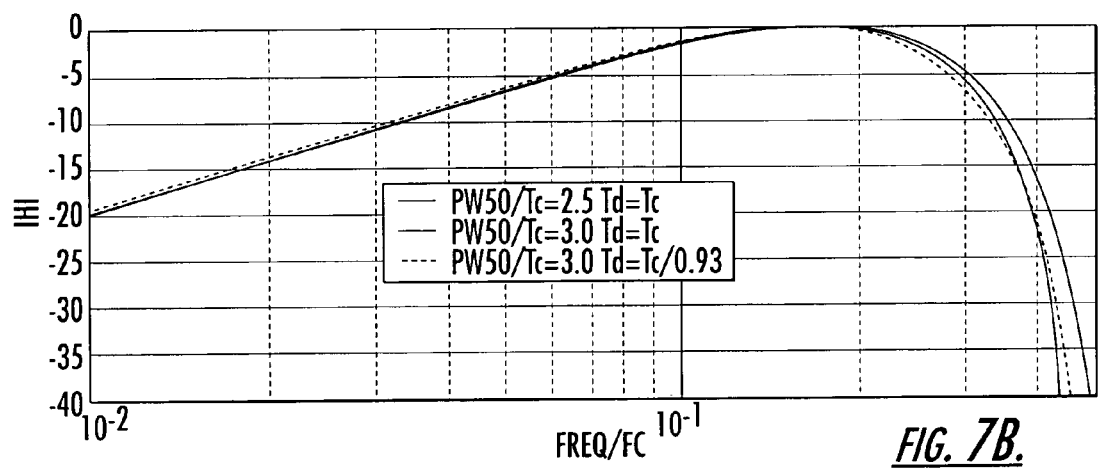
Figure 7C:
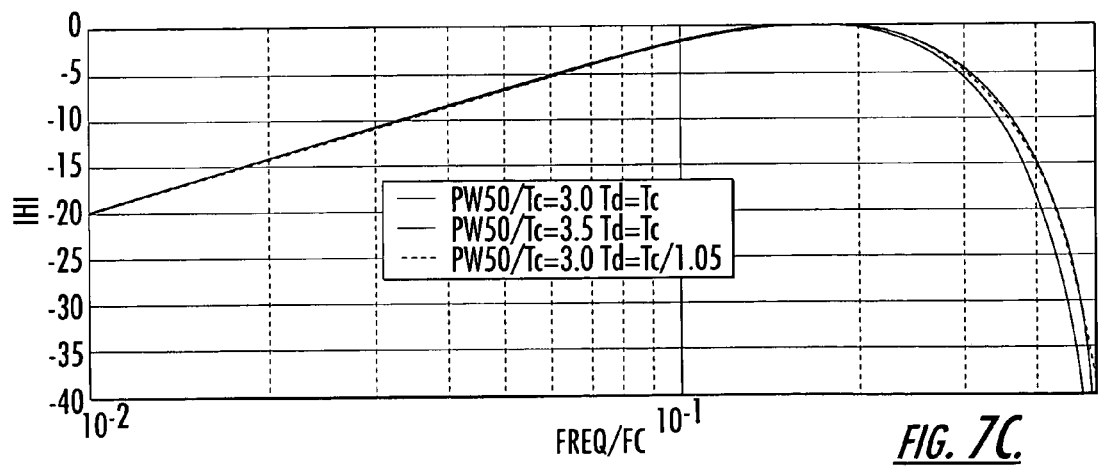

Thus, according to the invention, a FIR with fixed coefficients can be used, and use can be made of the programmed delay Td=k*Tc to obtain a desired frequency response according to the different storage densities. Plotted in FIG. 7A is the transfer function of a Hilbert transform approximated for three different storage densities.

It will be appreciated from the foregoing that the filter and filtering method of this invention have a major advantage in that they allow data to be read from magnetic storage media used in the perpendicular recording mode, at the expense of only minor modifications in current apparatus for reading information from such magnetic storage media.

That which is claimed is:

1. A finite impulse response (FIR) filter for implementing a Hilbert transform, the FIR filter comprising:
   a plurality of programmable delay cells connected in cascade between an input terminal of the FIR filter and an output terminal of the FIR filter, each programmable delay cell having associated therewith a constant filter coefficient and a programmable delay coefficient.

2. A FIR filter according to claim 1, wherein a length of each constant filter coefficient is substantially equal to a length of each programmable delay coefficient.

3. A FIR filter according to claim 1, wherein the programmable delay coefficient for each programmable delay cell is individually programmable.

4. A decoding circuit for a magnetic storage medium comprising:
   an amplifier having an input for receiving a data signal from the magnetic storage medium; and
   a finite impulse response (FIR) filter connected to said amplifier for implementing a Hilbert transform on the data signal, said FIR filter comprising
   a plurality of programmable delay cells connected in cascade between an input terminal of said FIR filter and an output terminal of said FIR filter, each programmable delay cell having associated therewith a constant filter coefficient and a programmable delay coefficient.

5. A decoding circuit according to claim 4, wherein the decoding circuit further comprises:
   a low pass filter connected to said FIR filter;
   a digital-to-analog converter connected to said low pass filter; and
   an equalizer connected to said digital-to-analog converter.

6. A decoding circuit according to claim 5, wherein the decoding circuit performs a Partial Response with Maximum Likelihood (PRML) decoding.

7. A decoding circuit according to claim 4, wherein the magnetic storage medium comprises a hard disk.

8. A decoding circuit according to claim 4, wherein the magnetic storage medium stores data in the vertical direction.

9. A decoding circuit according to claim 4, wherein a length of each constant filter coefficient is substantially equal to a length of each programmable delay coefficient.

10. A decoding circuit according to claim 4, wherein the programmable delay coefficient for each programmable delay cell is individually programmable.

11. A magnetic recording device comprising:
    a magnetic storage medium; and
    a decoding circuit connected to said magnetic storage medium, said decoding circuit comprising
    an amplifier having an input for receiving a data signal from said magnetic storage medium, and a finite impulse response (FIR) filter connected to said amplifier for implementing a Hilbert transform on the data signal, said FIR filter comprising
a plurality of programmable delay cells connected in cascade between an input terminal of said FIR filter and an output terminal of said FIR filter, each programmable delay cell having associated therewith a constant filter coefficient and a programmable delay coefficient.

12. A magnetic recording device according to claim 11, wherein said decoding circuit further comprises:
a low pass filter connected to said FIR filter;
a digital-to-analog converter connected to said low pass filter; and
an equalizer connected to said digital-to-analog converter.

13. A magnetic recording device according to claim 11, wherein said magnetic storage medium comprises a hard disk.

14. A magnetic recording device according to claim 11, wherein said decoding circuit performs a Partial Response with Maximum Likelihood (PRML) decoding.

15. A magnetic recording device according to claim 11, wherein said magnetic storage medium stores data in the vertical direction.

16. A magnetic recording device according to claim 11, wherein a length of each constant filter coefficient is substantially equal to a length of each programmable delay coefficient.

17. A magnetic recording device according to claim 11, wherein the programmable delay coefficient for each programmable delay cell is individually programmable.

18. A method of filtering a signal having a spectrum that is unknown a priori, the method comprising:
performing a Hilbert transform on the signal using a finite impulse response (FIR) filter that comprises a plurality of programmable delay cells connected in cascade between an input terminal of the FIR filter and an output terminal of the FIR filter, each programmable delay cell having associated therewith a constant filter coefficient and a programmable delay coefficient.

19. A method according to claim 18, wherein a length of each constant filter coefficient is substantially equal to a length of each programmable delay coefficient.

20. A method according to claim 18, further comprising individually programming each programmable delay cell.

21. A method of decoding a data signal from a magnetic storage medium comprising:
amplifying the data signal from the magnetic storage medium; and
performing a Hilbert transform on the data signal using a finite impulse response (FIR) filter that comprises a plurality of programmable delay cells connected in cascade between an input terminal of the FIR filter and an output terminal of the FIR filter, each programmable delay cell having associated therewith a constant filter coefficient and a programmable delay coefficient.

22. A method according to claim 21, further comprising:
filtering the data signal using a low pass filter;
performing a digital-to-analog conversion on the data signal; and
equalizing the converted data signal.

23. A method according to claim 22, wherein the decoding circuit performs a Partial Response with Maximum Likelihood (PRML) decoding.

24. A method according to claim 21, wherein the magnetic storage medium comprises a hard disk.

25. A method according to claim 21, wherein the magnetic storage medium stores data in the vertical direction.

26. A method according to claim 21, wherein a length of each constant filter coefficient is substantially equal to a length of each programmable delay coefficient.

27. A method according to claim 21, further comprising individually programming each programmable delay cell.

* * * * *

UNITED STATES PATENT AND TRADEMARK OFFICE
CERTIFICATE OF CORRECTION

PATENT NO.      : 7,024,447 B2                          Page 1 of 2
APPLICATION NO. : 09/794303
DATED           : April 4, 2006
INVENTOR(S)     : Pisati et al.

It is certified that error appears in the above-identified patent and that said Letters Patent is hereby corrected as shown below:

| | |
|---|---|
| Title Page, Section 73, Assignee | Delete: "(IL)"<br>Insert: --(IT)-- |
| Column 2, Lines 21-26 | Delete: "Based on this principle, the technical problem is solved by a filter as previously indicated and defined in Claims 1 and following.<br>    The technical problem is further solved by a filtering method for processing signals having spectrum unknown beforehand, as defined in Claims 5 and following."<br><br>Insert: --Another aspect of the present invention is a decoding circuit for a magnetic storage medium that preferably comprises an amplifier having an input for receiving a data signal from the magnetic storage medium, and a finite impulse response (FIR) filter connected to the amplifier for implementing a Hilbert transform on the data signal.<br>    The FIR filter preferably comprises a plurality of programmable delay cells connected in cascade between an input terminal of the FIR filter and an output terminal of the FIR filter. Each programmable delay cell has associated therewith a constant filter coefficient and a programmable delay coefficient.<br>    The decoding circuit may further comprise a low pass filter connected to the FIR filter, a digital-to-analog converter connected to the low pass filter, and an equalizer connected to the digital-to-analog converter. The decoding circuit may perform a Partial Response with Maximum Likelihood (PRML) decoding. |

UNITED STATES PATENT AND TRADEMARK OFFICE
CERTIFICATE OF CORRECTION

PATENT NO. : 7,024,447 B2
APPLICATION NO. : 09/794303
DATED : April 4, 2006
INVENTOR(S) : Pisati et al.

It is certified that error appears in the above-identified patent and that said Letters Patent is hereby corrected as shown below:

Column 2, Lines 21-26 (cont.)   Yet another aspect of the present invention is a method of filtering a signal having a spectrum that is unknown a priori. The method comprises performing a Hilbert transform on the signal using a finite impulse response (FIR) filter that comprises a plurality of programmable delay cells connected in cascade between an input terminal of the FIR filter and an output terminal of the FIR filter. Each programmable delay cell preferably has associated therewith a constant filter coefficient and a programmable delay coefficient. The method further includes individually programming each programmable delay cell.--

Column 3, Line 8    Delete: "Likelyhood"
Insert: --Likelihood--

Column 3, Line 35   Delete: "recording."
Insert: --recording. The transfer function provided by the invention is aimed at minimizing the number of coefficients of the Hilbert FIR by imposing a 90° phase shift in the range of interest, but accepting a substantially non-constant module.--

Signed and Sealed this

Fifth Day of December, 2006

JON W. DUDAS
*Director of the United States Patent and Trademark Office*